US00RE42846E

(19) United States
(12) Reissued Patent
Zhang et al.

(10) Patent Number: US RE42,846 E
(45) Date of Reissued Patent: Oct. 18, 2011

(54) CLOSE-LOOP CLASS-D AUDIO AMPLIFIER AND CONTROL METHOD THEREOF

(75) Inventors: Junming Zhang, Hangzhou (CN); Yuancheng Ren, Hangzhou (CN); Yunping Lang, Hangzhou (CN)

(73) Assignee: Monolithic Power Systems, Inc., San Jose, CA (US)

(21) Appl. No.: 12/968,216

(22) Filed: Dec. 14, 2010

Related U.S. Patent Documents

Reissue of:
(64) Patent No.: 7,728,666
Issued: Jun. 1, 2010
Appl. No.: 12/169,539
PCT Filed: Jul. 8, 2008

(30) Foreign Application Priority Data

Aug. 16, 2007 (CN) ..... 2007 1 0141041

(51) Int. Cl.
*H03F 3/217* (2006.01)
(52) U.S. Cl. ..... 330/251; 330/207 A; 330/291
(58) Field of Classification Search ..... 330/251, 330/207 A, 291
See application file for complete search history.

(56) References Cited

U.S. PATENT DOCUMENTS

| | | | | |
|---|---|---|---|---|
| 5,543,753 | A * | 8/1996 | Williamson | 330/297 |
| 5,805,020 | A * | 9/1998 | Danz et al. | 330/10 |
| 6,078,214 | A * | 6/2000 | Zhang | 330/10 |
| 6,952,131 | B2 * | 10/2005 | Jeong et al. | 330/10 |
| 6,998,911 | B2 * | 2/2006 | Honda et al. | 330/10 |
| 7,355,473 | B2 * | 4/2008 | Wu | 330/10 |

* cited by examiner

*Primary Examiner* — Patricia Nguyen
(74) *Attorney, Agent, or Firm* — Zilka-Kotab, PC

(57) ABSTRACT

The present invention discloses a Class-D power amplifier and control method thereof. In one embodiment, the amplifier feeds back the signal at the output node to the inverting input of the comparator, and provides a high frequency triangular wave signal to the non-inverting input of the comparator. In addition, the non-inverting input of the comparator may be coupled to an offset voltage, while the inverting input of the comparator may be coupled to a fixed-frequency rectangular wave signal, a feedback signal which is derived from the output stage and an input signal. In use, the switching frequency may be at least substantially fixed, so as to reduce the influence on the system caused by electromagnetic interruption (EMI). Further, the control circuit is simple, and some devices can be integrated.

16 Claims, 15 Drawing Sheets

CLOSE-LOOP CLASS-D AUDIO AMPLIFIER AND CONTROL METHOD THEREOF

Matter enclosed in heavy brackets [ ] appears in the original patent but forms no part of this reissue specification; matter printed in italics indicates the additions made by reissue.

RELATED APPLICATION DATA

This application claims the benefit of the filing date of [CN application Serial] *Chinese Patent Application* No. [200710140141.2] *200710141041.2* filed on Aug. 16, 2007 and incorporated herein by reference.

FIELD OF THE INVENTION

The present invention relates generally to a Class-D power amplifiers and particularly to a close-loop fixed-frequency Class-D power amplifier and control method thereof.

DESCRIPTION OF RELATED ART

There are many different kinds of power amplifiers, such as Class-A, Class-B, Class-AB, Class-D, etc. The Class-D power amplifier is different from other amplifiers for it is a switch-mode or pulse width modulation (PWM) power amplifier. In such Class-D power amplifier, devices are either absolutely on, or absolutely off, which highly reduces the power loss of the output devices. An audio signal is used to modulate the PWM carrier signal which drives the output power stage to get a high-frequency PWM rectangular wave, and then the amplifier outputs the audio signal to the load through a low-pass filter. At present, much attention is paid to improve the power density and reduce the cost when the Class-D power amplifier is designed. From the view of the circuit structure the Class-D audio amplifier can be seen as a conventional inverter which generates an amplified audio signal from a DC power supply input according to a reference audio signal. Therefore, all conventional close-loop feedback control methods can be used in Class-D audio amplifiers such as instantaneous voltage mode feedback control or voltage & current double feedback loops control, etc. A typical device used in these control methods is an error amplifier. So the circuit structures are not only complicated but also high cost. The analog adaptive modulation (AAM) technology which is owned by Monolithic Power Systems® (MPS®), Inc. is a relatively simple method to realize the close-loop control of the Class-D power amplifier.

As shown in FIG. 1, resistors R1 and R2 form a voltage divider in the AAM structure. The voltage divider provides the non-inverting input of the comparator Pin with an offset which equals to ½Vcc. The comparator has an internal hysteresis loop. The comparator compares the input signal at node B with ½Vcc±dV, wherein dV represents the hysteresis voltage of the comparator. The output PWM wave of the comparator controls the transisitors M1 and M2 to be turned on alternately through the drive circuit. The source of the transistor M1 is coupled to the output node C, while the source of the transistor M2 is grounded. The drain of the transistor M1 is couple to the supply Vcc, while the drain of transistor M2 is coupled to the output node C. The transistors M1 and M2 act as switches, which constitute a part of the output stage of the Class-D power amplifier circuit, so as to generate a rectangular wave at the output node C when the output stage is used in switch mode. The SW signal at the output node C is restored to an amplified audio signal through a filter circuit composed of the inductor L and capacitor C1, and the blocking capacitor C2, and then delivered to the load (for example, a loudspeaker). Meanwhile, the SW signal charges/discharges the capacitor Cint through the resistor Rf to realize the adaptive control.

As shown in FIG. 2, when the output PWM rectangular wave at the output node C is high, the capacitor Cint is charged and the voltage at Nin (node B) increases until it reaches the upper limit of the hysteresis loop. Then the high side transistor M1 is turned off and the low side transistor M2 is turned on, which induces the output PWM rectangular wave to be low. When the output PWM rectangular wave at the output node C is low, the Cint is discharged until the voltage at Nin decreases to lower limit of the hysteresis loop. Then the low side transistor M2 is turned off and the high side transistor M1 is turned on, which induces the output PWM rectangular wave to be high. Such process is repeated to generate the high-frequency PWM rectangular wave at node C which will be filtered by the filter to get an amplified output audio signal. The feedback circuit feeds back the signal at the node C to the inverting input of the comparator to control the output audio signal to follow the input audio signal, and realize a certain gain amplification. The AAM technology allows a flexible gain set and can achieve good audio performance both in single ended (SE) and bridge tied load (BTL) structure. However, the switching frequency varies heavily during the operation and some electromagenetic interruption (EMI) problems may occur because the wide frequency spectrum may drop into the audio band (FM/AM) and decrease the sensitivity of FM/AM or disturb the video signal sometimes which restricts the use of this technology on occasion of vehicle electronics audio broadcast and so on.

Thus, it would be advantageous to provide a system and method that overcome these and other drawbacks of the prior art. For example, it would be advantageous to provide a fixed-frequency Class-D power amplifier and method thereof for reducing the influence on the system caused by EMI.

SUMMARY OF INVENTION

The present invention provides a method for close-loop control in a Class-D power amplifier which can keep a fixed-frequency to avoid the band of some important signals. The structure of the control circuit is simple, and some devices can be integrated.

In accordance with an embodiment, a close-loop class-D power amplifier is provided, comprising: an input stage for receiving an input signal, said input stage comprises a comparator and a triangular wave generator or a rectangular wave generator, said comparator receives said input signal and the high-frequency triangular wave generated by said triangular wave generator or the high-frequency rectangular wave generated by said rectangular wave generator, and then outputs a first signal; an output stage coupled to said input stage, responds to said first signal to generate a second signal; a filter coupled to the output node of said output stages for filtering said second signal to get an output signal; and a feedback circuit, coupled between the output node of said output stage and the input node of said input stage, shapes said second signal to get a feedback signal which is negatively feedback to said input stage, so as to subtract said feedback signal from said input signal.

In accordance with the power amplifier described above, said high-frequency triangular wave may be applied to the non-inverting input of said comparator, while said input signal and said feedback signal may be applied to the inverting input of said comparator, where said comparator may compare said high-frequency triangular wave with a signal which is gained by subtracting said feedback signal from said input signal, so as to get said first signal.

In accordance with the power amplifier described above, the DOC offset voltage may be applied to the non-inverting input of said comparator, said input signal, said feedback signal and said high-frequency rectangular wave may be applied to the inverting input of said comparator, where said comparator may compare said DC offset voltage with a signal which is gained by subtracting said feedback signal from said input signal and then adding it to said high-frequency rectangular wave, so as to get said first signal.

In accordance with the power amplifier described above, said feedback circuit may comprise a capacitor, the first terminal of said capacitor optionally coupled to said input signal, the inverting input of said comparator and said second signal, while the second terminal of said capacitor may be coupled to ground or the DC offset voltage.

In accordance with the power amplifier described above, said feedback circuit may further comprise a feedback resistor coupled between the first terminal of said capacitor and said second signal.

In accordance with the power amplifier described above, the chage/discharge effect on said capacitor of said high-frequency triangular wave or said high-frequency rectangular wave may be stronger than that of said second signal.

In accordance with the power amplifier described above, said input stage may comprise said comparator; and said output stage may comprise: a drive circuit coupled to said comparator; a half-bridge switch circuit coupled to said drive circuit, which may be alternately turned on according to the drive signals generated by said drive circuit, to generate one said second signal accordingly.

In accordance with the power amplifier described above, said input stage may comprise said comparator; and said output stage may comprise: a drive circuit coupled to said comparator; two half-bridge switch circuits coupled to said drive circuit, which may be alternately turned on according to the drive signals generated by said drive circuit, to generate two said second signals accordingly, and feed back one thereinto.

In accordance with the power amplifier described above, said input stage may comprise two said comparators; and said output stage may comprise: a drive circuit, coupled to said comparators separately; two half-bridge switch circuits coupled to said drive circuit separately, which may be alternately turned on according to the drive signals generated by said drive circuit, to generate two said second signals accordingly, and feed back signals to corresponding comparator separately.

In accordance with another embodiment, a control method for a close-loop class-D power amplifier is provided, comprising receiving an input signal and a high-frequency triangular wave generated by a triangular wave generator or a high-frequency rectangular wave generated by a rectangular wave generator, and outputting a first signal; responding to said first signal to generate a second signal; filtering said second signal to get an output signal; and shaping said second signal to get a feedback signal, and feeding back said feedback signal to the input terminal which receives said input signal, so as to subtract said feedback signal from said input signal.

In accordance with the control method described above, said first signal is responded in order to generate two of said second signals, at least one of the two said second signals are shaped, and the shaped signals are fed back to said input terminal.

The class-D power amplifier may use a comparator with a hysteresis loop which is small enough to be neglected instead of the hysteresis comparator used in the AAM structure. The low frequency pad of the signal output from the power stage may be counteracted with the input audio signal at the input terminal of the comparator, while the high frequency part may be sent to the comparator, so as to get a modulated output audio signal at the output terminal.

The non-inverting input of the comparator may be coupled to a fixed-frequency triangular wave signal, while the inverting input of the comparator may be coupled to the feedback signal from the output stage and an input signal.

As another options the non-inverting input of the comparator may be coupled to a DC offset voltage Vdd, while the inverting input of the comparator may receive a fixed-frequency rectangular wave signal, the feedback signal from the output stage and an input signals.

BRIEF DESCRIPTION OF THE DRAWINGS

The present invention can be further understood with reference to the following detailed description and the appended drawings, wherein like elements are provided with like reference signs.

DETAILED DESCRIPTION

Figure 3:
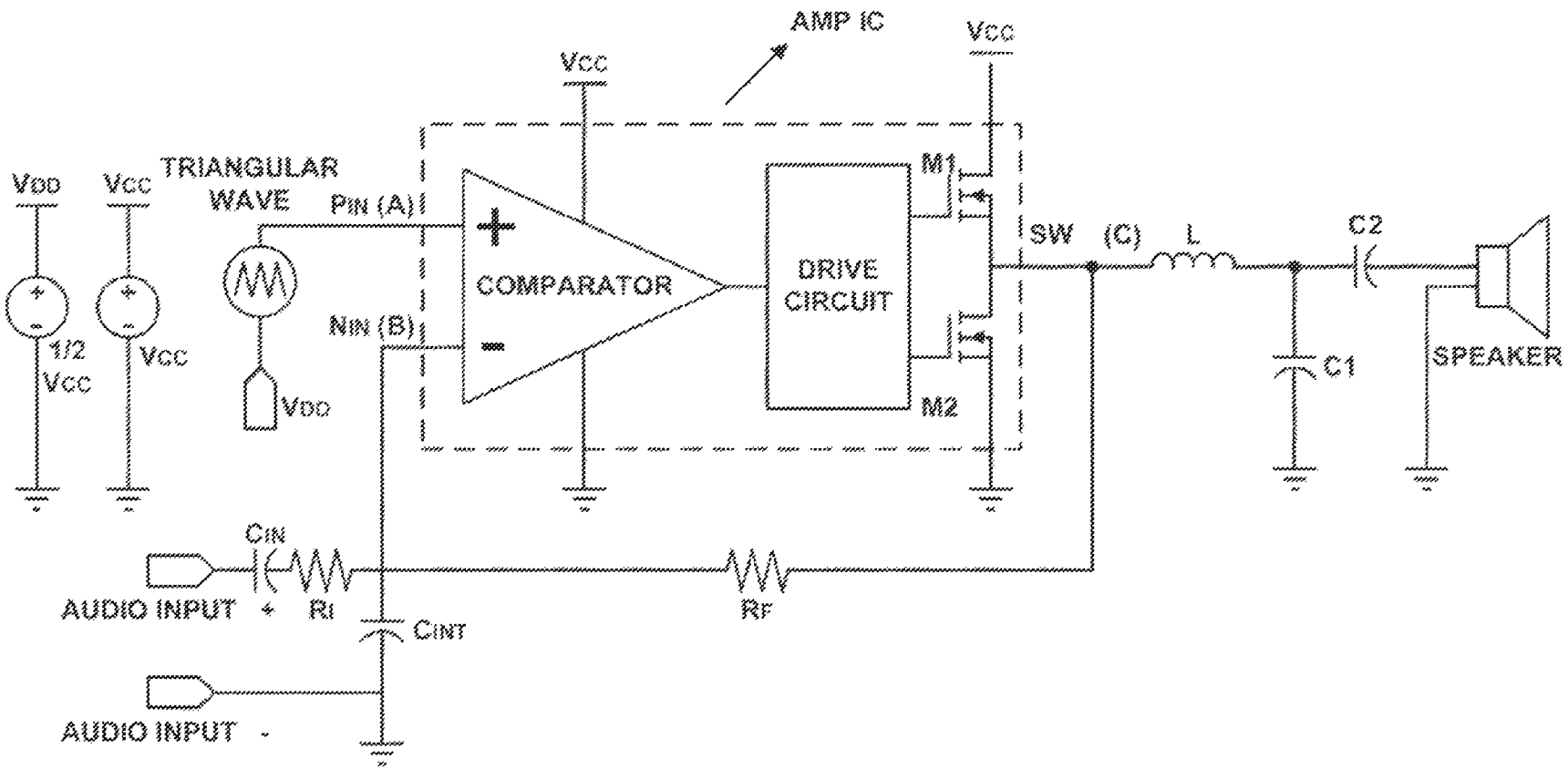
FIG. 3 illustrates a schematic circuit used in a SE Class-D power amplifier, in accordance with one embodiment.
Figure 5:
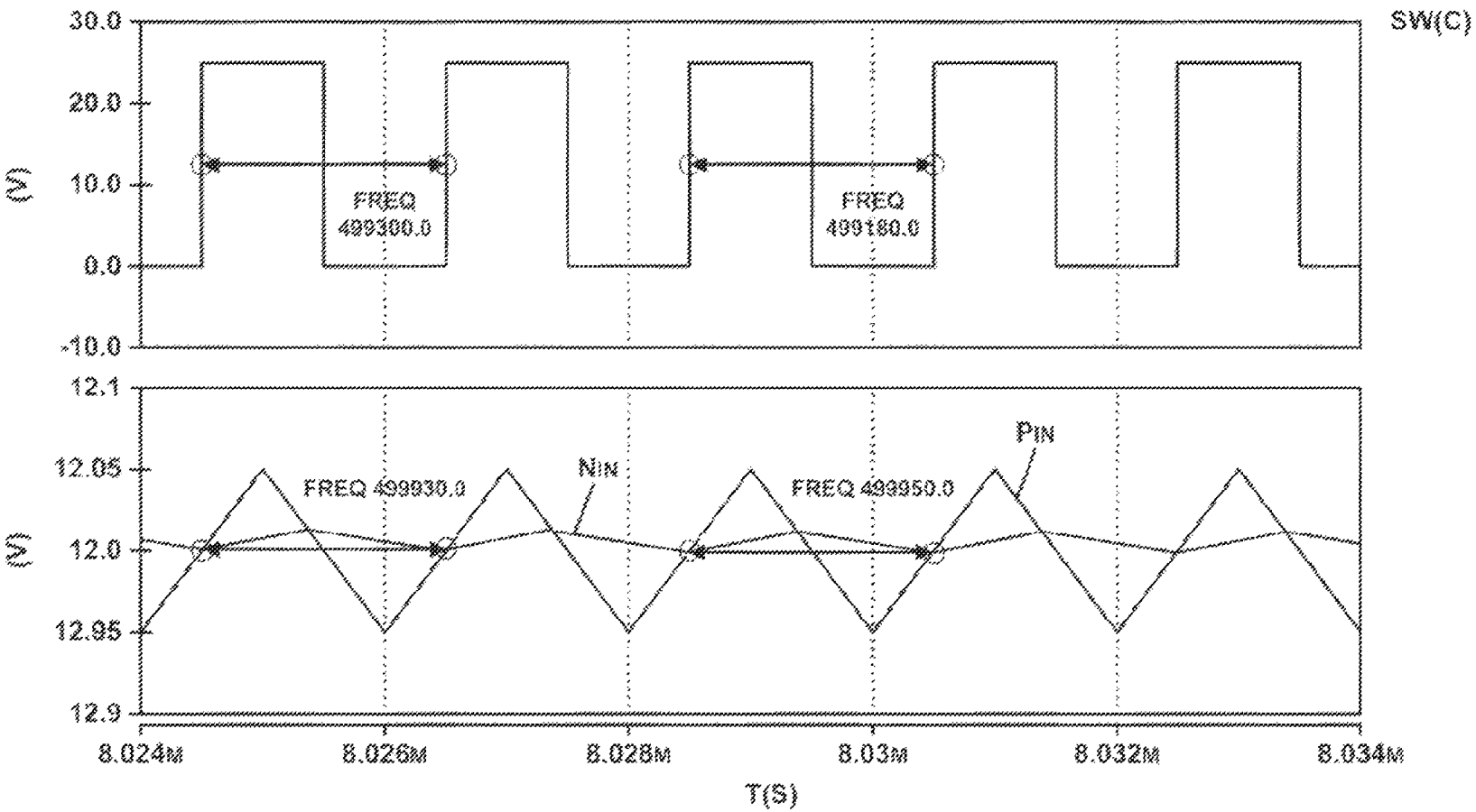
FIG. 5 illustrates the waveforms of the SW signal, the signal at the non-inverting input Pin and the signal at the inverting input Nin of the circuit shown in FIG. 3, in accordance with another embodiment.

FIG. 3 illustrates a schematic circuit in accordance with one embodiment, comprising a Class-D amplifier circuit and a load. A proper high-frequency (about hundreds of KHz) triangular wave with ½Vcc offset is applied to the non-inverting input of the comparator Pin (A) whose inverting input is Nin (B) coupled to ground through the capacitor Cint. The input audio signal charges/discharges the capacitor Cint through the resistors Ri and the capacitor Cin. The output PWM wave of the comparator controls the transistors M1 and M2 to be turned on alternatively through the drive circuit, wherein the source of the transistor M1 is connected to the output node C while the source of the transistor M2 is grounded. The drain of the transistor M1 is connected to power supply Vcc, while the drain of the transistor M2 is connected to the output node C. The transistors M1 and M2 act as switches that form a part of the output stage of the Class-D amplifier circuit to generate a rectangular wave output at the output node C when the output stage is used in switch mode. SW signal at the output node C is restored to an amplified audio signal through a filter circuit comprising the inductor L and capacitor C1, and the blocking capacitor C2, and then delivered to the load (for example, a loudspeaker). Meanwhile, the SW signal charges/discharges the capacitor Cint through the resistor Rf. The charge/discharge effects produced by the audio signal and the SW signal at the output node C may be exactly counteracted. Thus, the inverting input of the comparator Nin may keep following the voltage of the non-inverting input of the comparator Pin under the function of both Vsw_low and the audio input signal. When the output of the comparator is high, the transistor M1 is turned on and the transistor M2 is turned off. The voltage $V_{Nin}$ at the inverting input of the comparator Nin is compared with a sum of the voltage at the non-inverting input of the comparator Pin and the hysteretic voltage dV, Vpin+dV (wherein dV represents hystereric voltage of the comparator). The SW signal is high at this time, which after feedback causes the voltage at Nin to raise till it becomes larger than the voltage Vpin+dV. Then the output of the comparator becomes low, the transistor M1 is turned off and the transistor M2 is turned on. The voltage at the inverting input of the comparator Nin is compared with the voltage Vpin−dV at this time. The feedback of the low SW signal causes the voltage at Nin to drop till it becomes less than the voltage Vpin−dV. The output of the comparator becomes high, causing the SW signal to be high, circularly (e.g. as shown in FIG. 5). Therefore, to realize fixed-frequency feedback control and ensure the system working steadily, the raising and dropping rates of the voltage at Nin may optionally be less than the changing slope of the given triangular wave at Pin. So the changing slope of the triangular wave may be taken into consideration when the capacitor Cint and the feedback resistor Rf are designed. The gate drive signals of the transistors M1 and M2 can be gained from the high-frequency part of the SW signal under the modulation of the high-frequency triangular carrier wave of non-inverting input Pin. The gain of the amplifier is confirmed by the ratio of resistors Rf and Ri.

Figure 4:
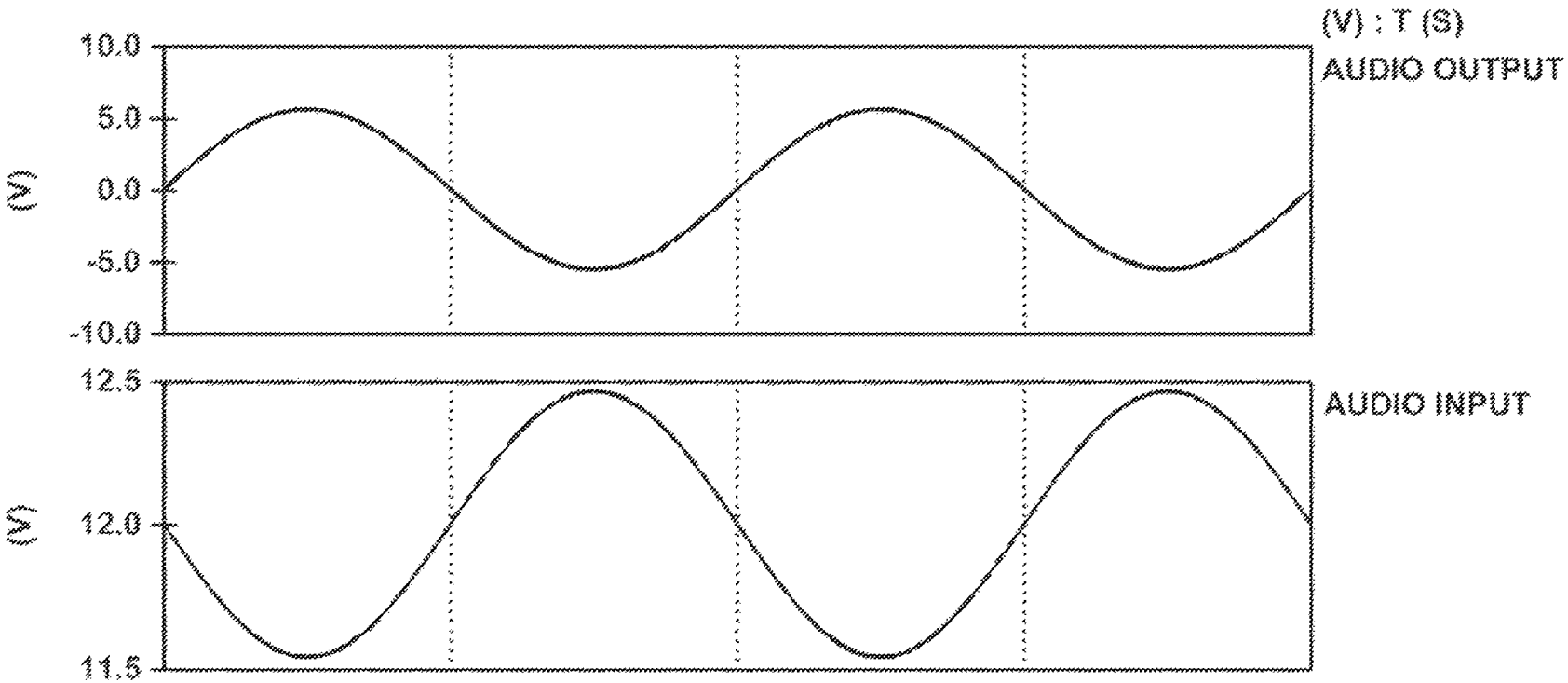
FIG. 4 illustrates the waveforms of the input audio signal and the output audio signal of the circuit shown in FIG. 3, in accordance with another embodiment.

Optional embodiments of key operation waveforms of the circuit in FIG. 3 are illustrated in FIG. 4 and FIG. 5. Switch control method in accordance with another embodiment is apparent in FIG. 5. When the input audio signal changes, the SW signal can be adaptively modulated by this system to let the voltage at the inverting input Nin always follow the non-inverting input Pin so as to control the output. Of course, the switching frequency is not unchangeable but has a minor change at the range of hundreds of HZ. This change is caused by the small audio sine signal at the inverting input of the comparator which also can charge/discharge the capacitor Cint. However, the change like this is very small relative to the switching frequency, so this control method can be seemed as a fixed-frequency control all the same.

Figure 1:
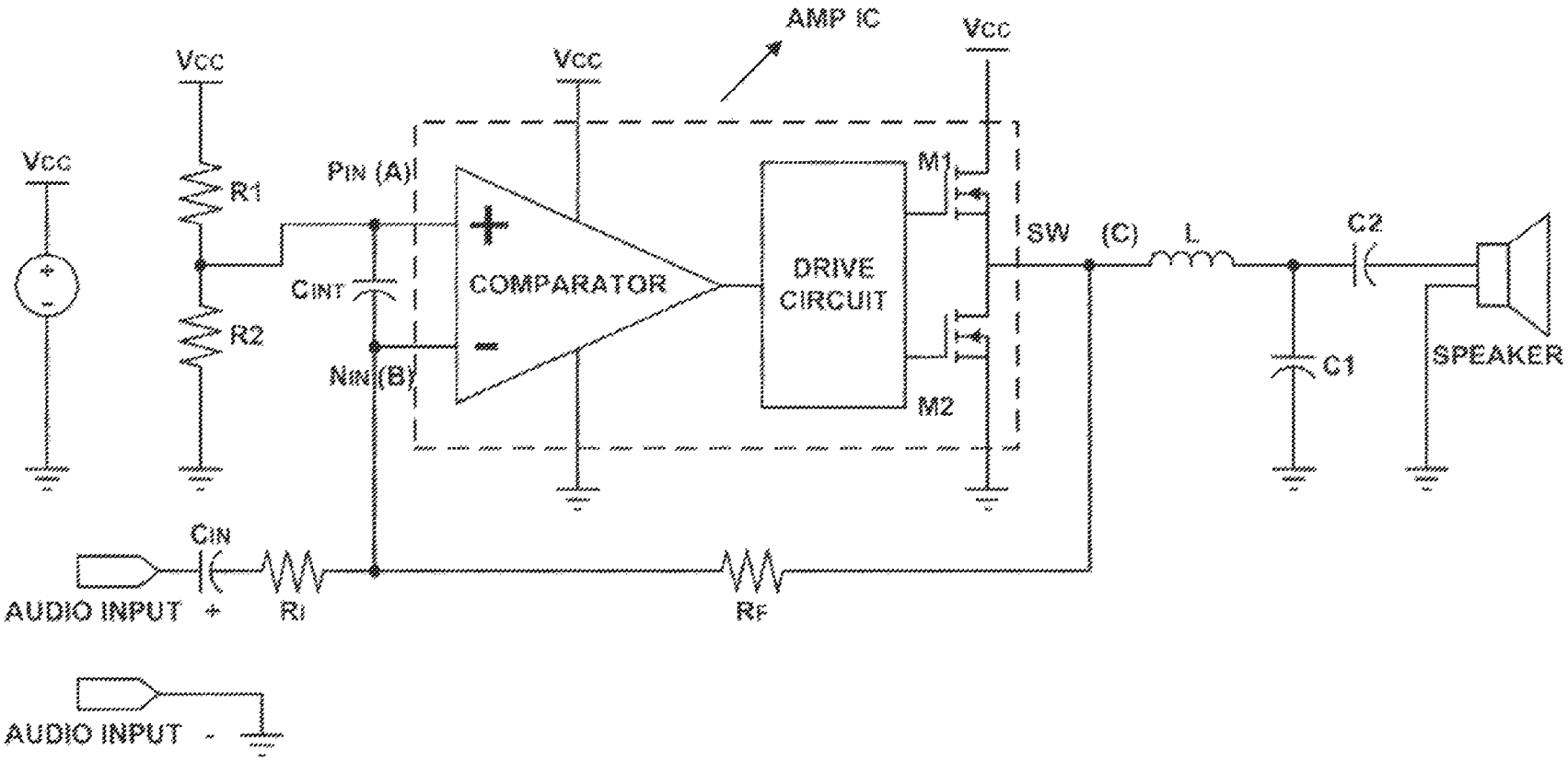
FIG. 1 illustrates a drive circuit of the prior art AAM Class-D power amplifier.
Figure 2:
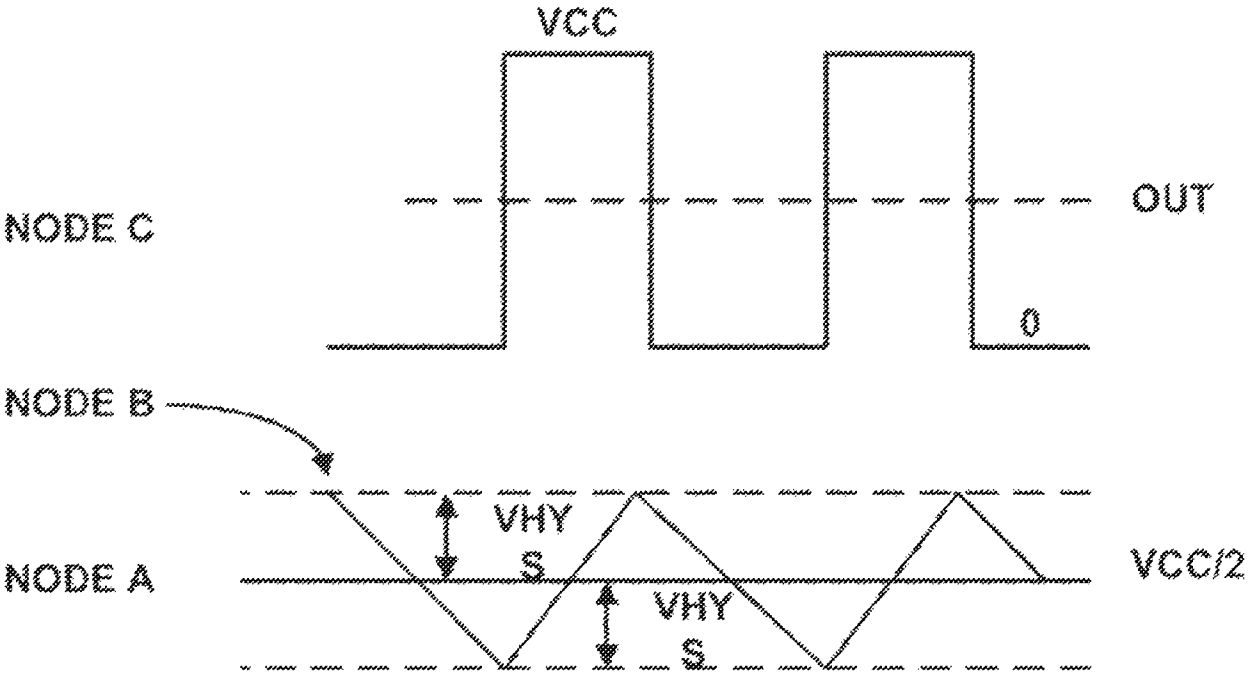
FIG. 2 is the operation waveform of the prior art AAM Class-D power amplifier.
Figure 6:
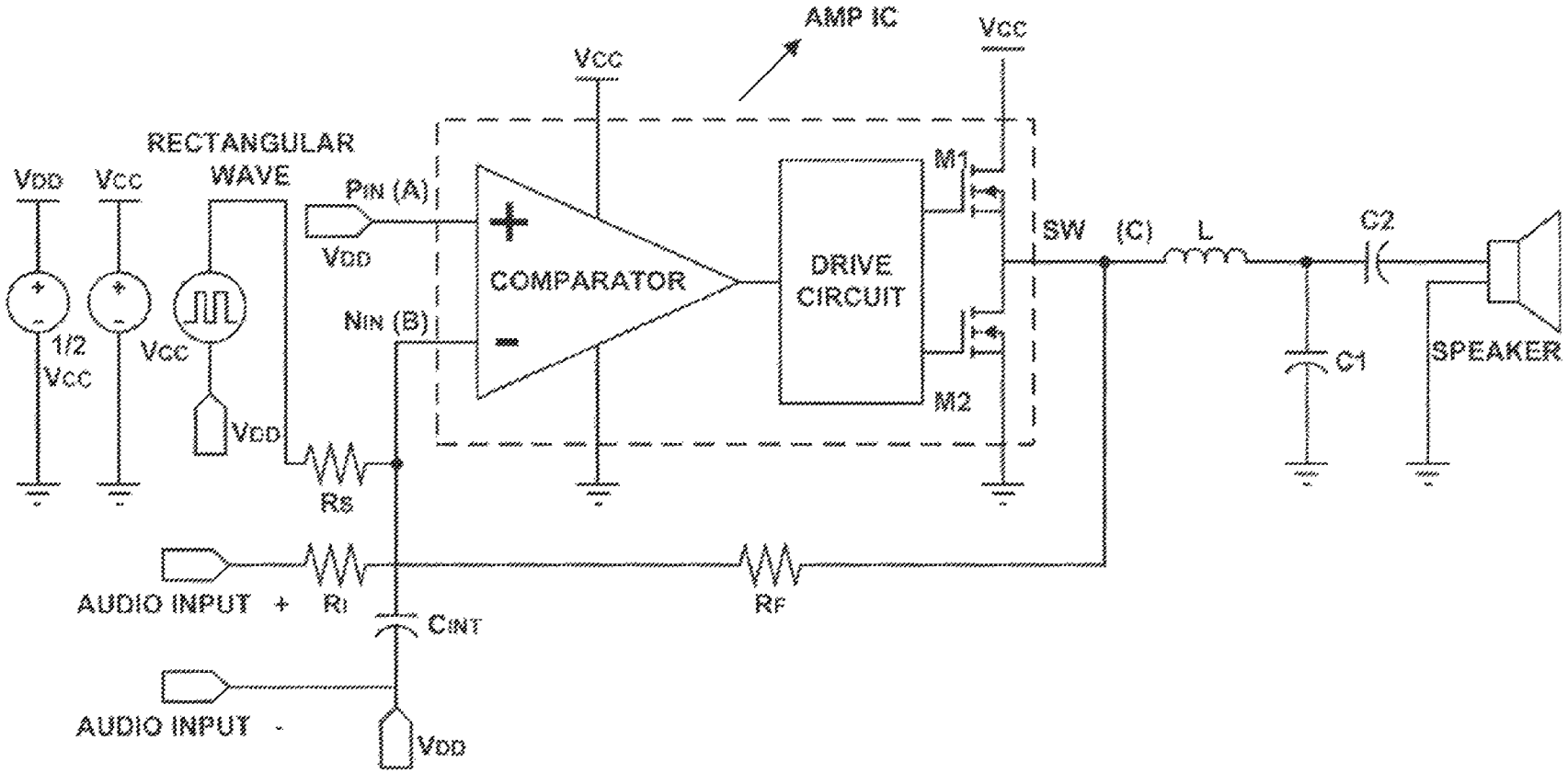
FIG. 6 illustrates a schematic circuit used in a SE Class-D power amplifier, in accordance with still another embodiment.

FIG. 6 illustrates a schematic circuit in accordance with another embodiment. Its basic configuration is similar to FIG. 1 except that the triangular wave applied to the non-inverting input Pin in FIG. 1 is replaced by a rectangular wave with ½ Vcc offset applied to the inverting input Nin via the resistor Rs while the non-inverting input of the comparator Pin is directly coupled to ½ Vcc DC offset. The charge/discharge effect on the capacitor Cint of the rectangular wave is similar to the effect of the triangular wave directly applied to the non-inverting input Pin of the comparator. In former embodiments the slope rate of the given triangular wave may need to be always larger than that of the voltage at the inverting input Nin, i.e. the high-frequency charge/discharge ripple at the integral capacitor Cint. The charge/discharge effect on the capacitor Cint of the triangular wave may also need to be stronger than the charge/discharge effect of the feedback signal SW. Likewise, in this embodiment, the charge/discharge effect on the capacitor Cint of the given rectangular wave may need to be stronger than the effect of the feedback signal SW.

Figure 7:
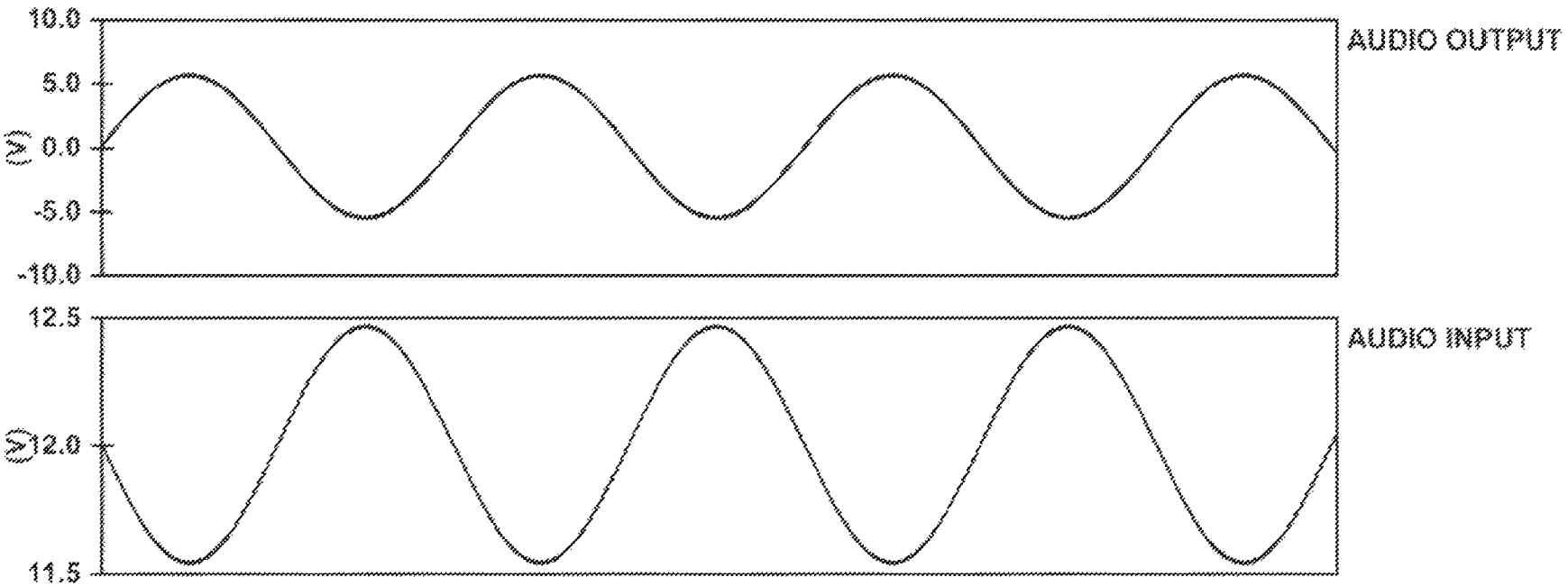
FIG. 7 illustrates the waveforms of the input audio signal and the output audio signal of the circuit shown in FIG. 6, in accordance with another embodiment.
Figure 8:
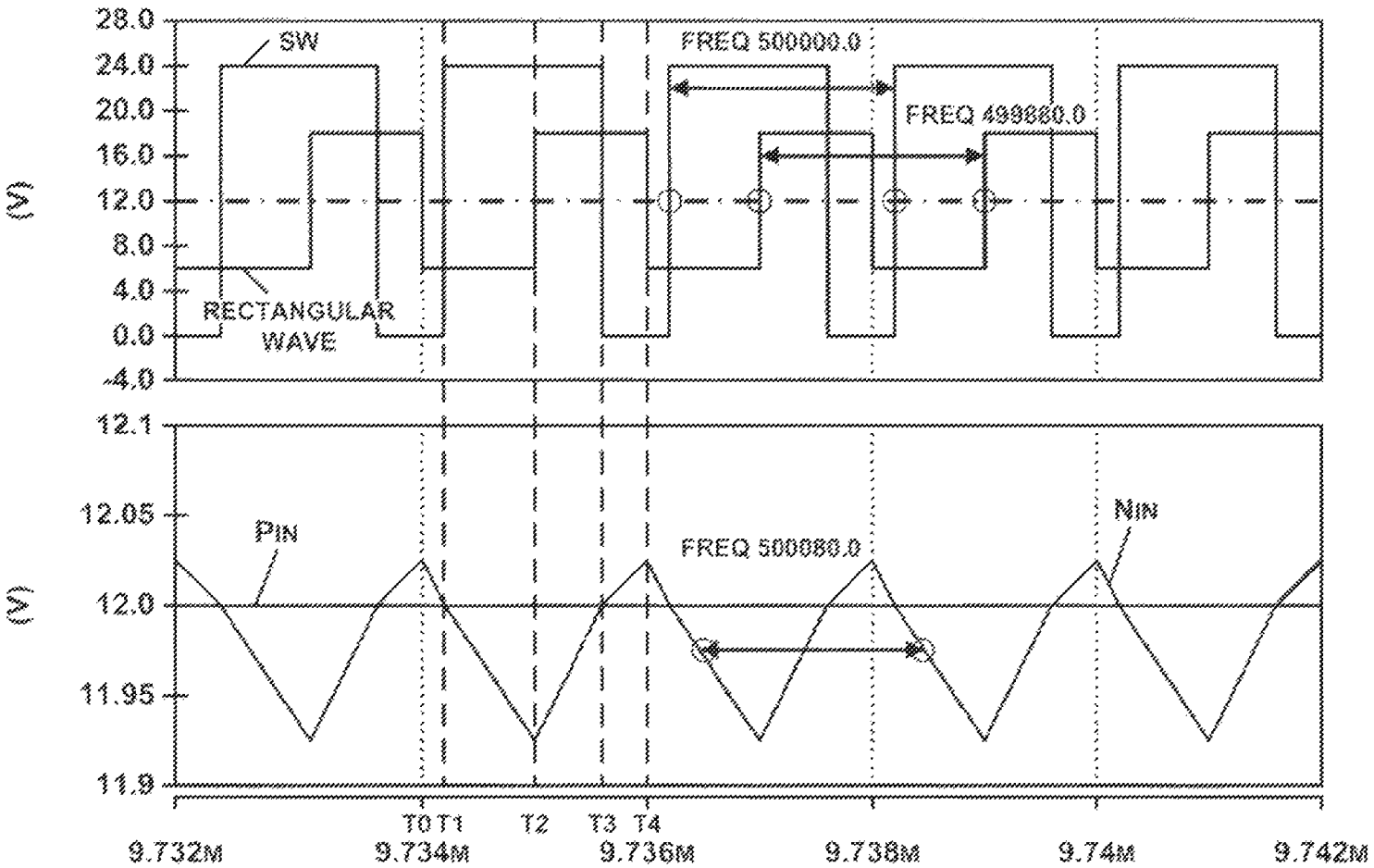
FIG. 8 illustrates the waveforms of the rectangular wave, the SW signal, the signal at the non-inverting input Pin and the signal at the inverting input Nin of the circuit shown in FIG. 6, in accordance with another embodiment.

Optional embodiments of key operation waveforms of the circuit in FIG. 6 are illustrated in FIG. 7 and FIG. 8. Referring to FIG. 8, a period cycle can be divided into 5 phases:

Phase 1 (t0–t1): At t=t0, the rectangular wave becomes low. The SW signal and the rectangular wave signal discharge the capacitor Cint at the same time. The voltage Vcint of the capacitor Cint keeps falling.

Phase 2 (t1–t2): At t=t1, Vcint<½Vcc, the output of the comparator is reversed, and the SW signal becomes high. The SW signal charges Cint while the rectangular wave keeps discharging Cint at the same time. Since the discharge effect is stronger, Vcint keeps failing at a slow rate.

Phase 3 (t2–t3): At t=t2, the rectangular wave becomes high. The SW signal and the rectangular wave charge the Cint at the same time. Vcint raises.

Phase 4 (t3–t4): At t=t5, Vcint>½Vcc, the output of the comparator is reversed again, and the SW signal becomes low. The SW signal discharges Cint while the rectangular wave keeps charging Cint at the same time. Since the charge effect is stronger, Vcint keeps raising at a slow rate.

Phase 5 (t4–t5): At t=t4, the rectangular wave becomes low. The SW signal and the rectangular wave discharge the Cint at the same time. Vcint falls.

As mentioned before, to realize the proposed fixed-frequency feedback control of this embodiment, the voltage at Nin may be required to keep falling when the SW signal becomes high in Phase 2 and keep raising in Phase 4. The following formula may need to be fulfilled while the feedback resistor Rf, the voltage Vrectangular of the rectangular wave with ½ Vcc offset, the SW signal Vsw and the resistor Rs are designed:

$$\left|\frac{V_{rectangular} - V_{Cint}}{R_s}\right| > \left|\frac{V_{sw} - V_{Cint}}{R_f}\right|$$

Accordingly, the charge/discharge effect on the capacitor Cint of the given rectangular wave may be required to be stronger than the effect of the feedback signal SW in this embodiment. Since the charge/discharge effect on the capacitor of the rectangular wave is greatly stronger than the effect of feedback signal SW, although there is a change with hundreds of HZ, the frequency of the SW signal which is decided by the frequency of the rectangular wave is fixed as a whole.

Figure 9:
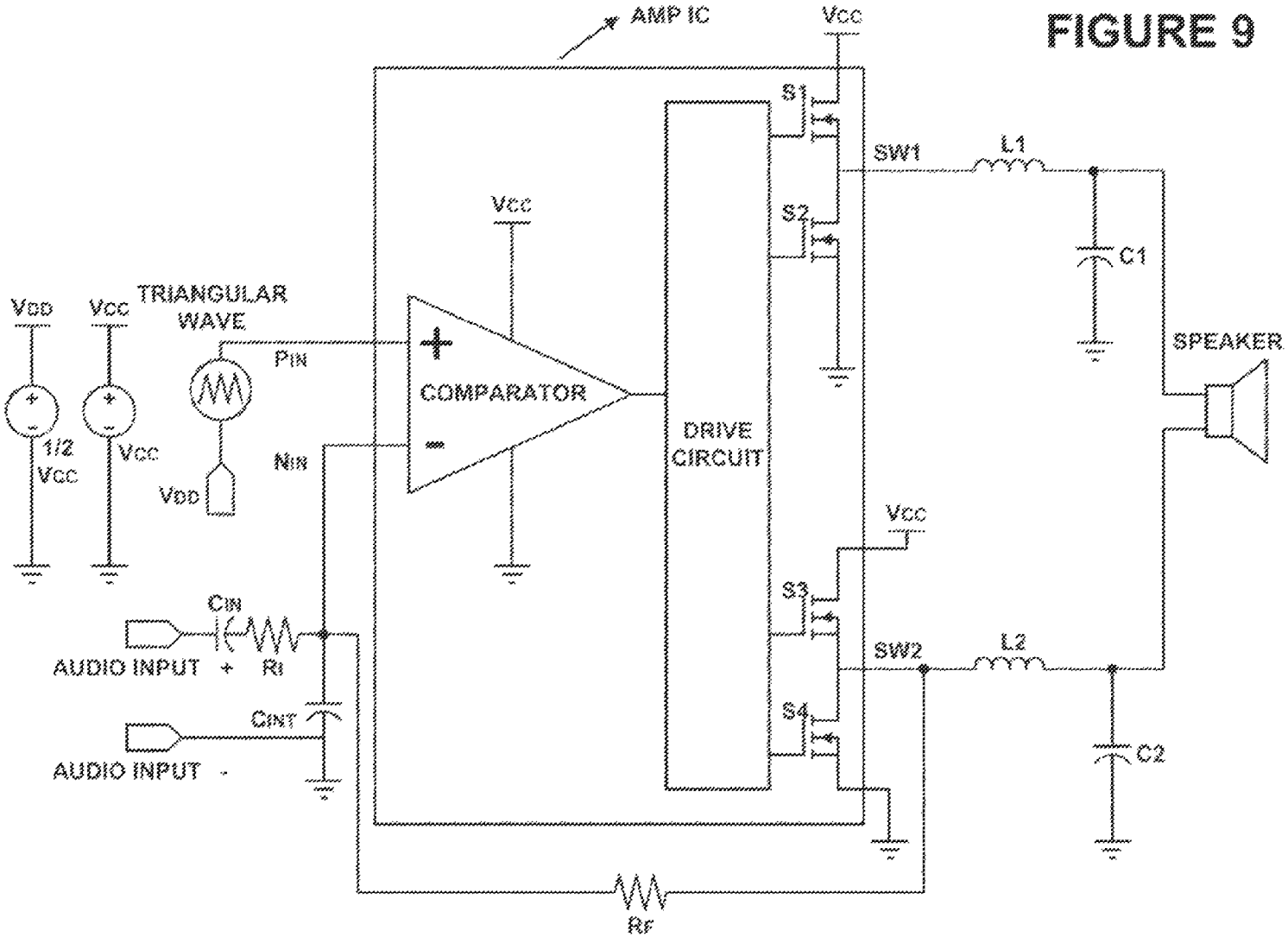
FIG. 9 illustrates a schematic circuit used in a BTL Class-D power amplifier, in accordance with still another embodiment.
Figure 10A:
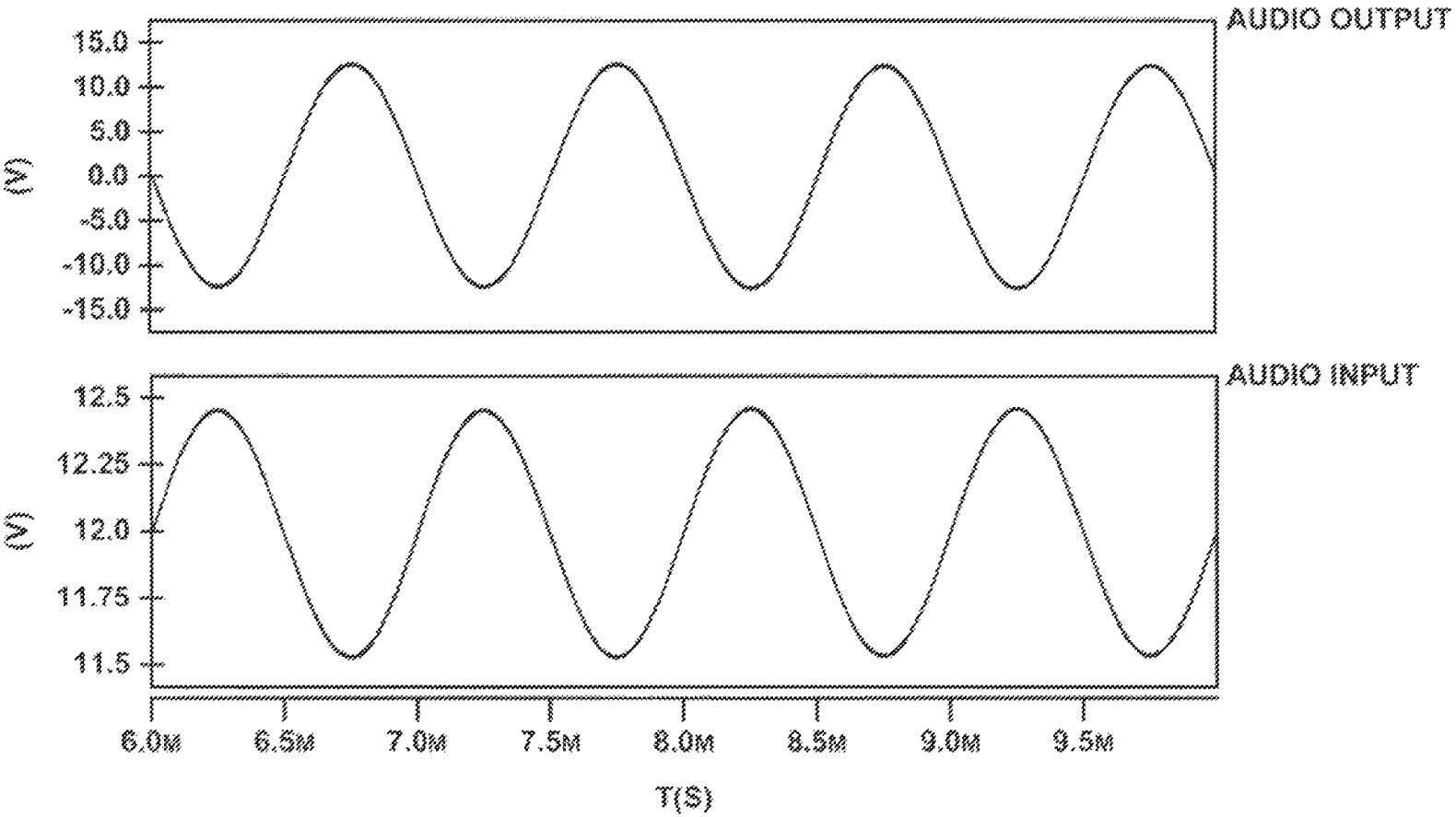
FIG. 10 (a) and FIG. 10 (b) illustrate part of the waveforms of the circuit shown in FIG. 9, in accordance with another embodiment.
Figure 10B:
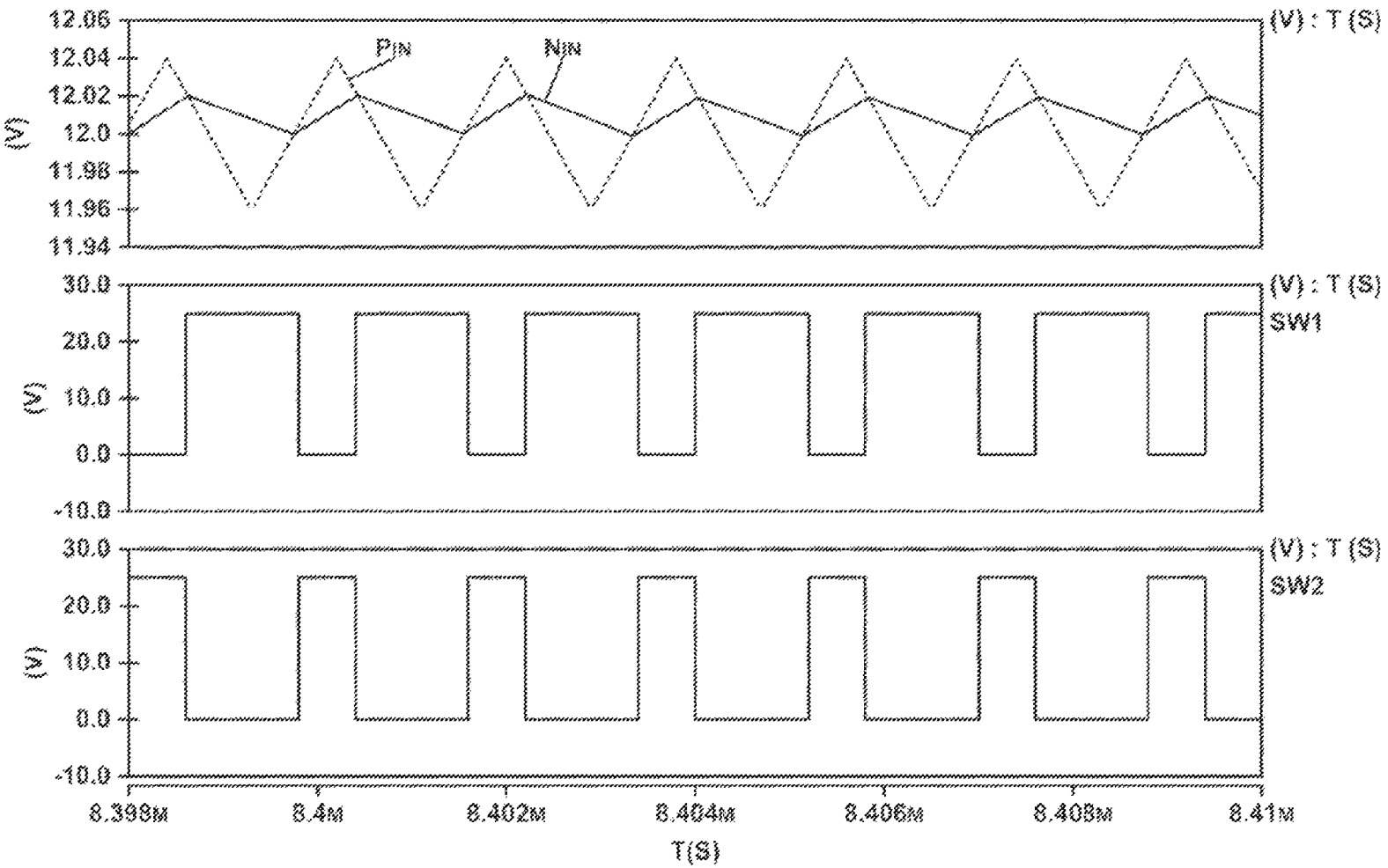

Similar to the SE Class-D power amplifier mentioned before, the present invention also can be used in BIT power amplifier. Harmonic distortion and DC offset can be eliminated by the inherence differential output structure of the bridge type topology. FIG. 9 illustrates a schematic circuit in accordance with another embodiment. The H-bridge comprises 2 half-bridge switching circuits which are powered by single power supply Vcc generally. For given Vcc, the max amplitude of the output signal in H-bridge circuit is 2 timers larger than which in single ended manner, while the output power is 4 timers larger. Only one comparator is used, whose output controls the transistors S1,S2,SS3 and S4 to be turned on alternately through the drive circuit so as to get two phase opposite signals SW1 and SW2 which are delivered to the load through the filter L1, C1 and L2, C2, Only one of the SW1 and SW2 may need to be fed back and used in feedback control loop. In FIG. 9 SW2 is used as a feedback signal FIG. 11(a) illustrates optional waveforms of audio input and audio output of the circuit shown in FIG. 9, while FIG. 10(b) illustrates optional partly magnified operation waveforms in which the SW1 signal can be gained through the phase-reversal of the SW2 signal.

Figure 11:
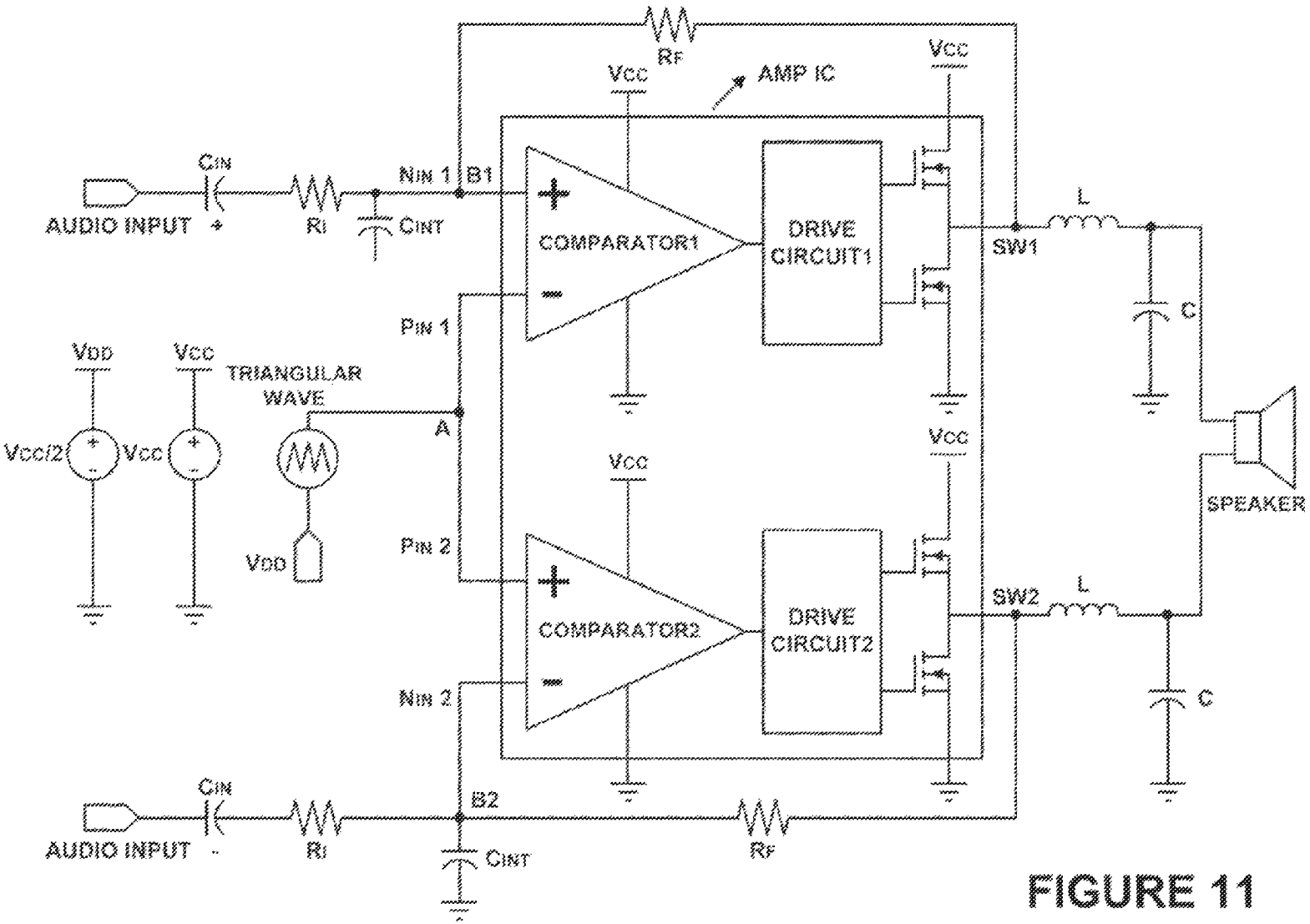
FIG. 11 illustrates a schematic circuit used in a BTL Class-D power amplifier, in accordance with another embodiment.
Figure 12A:
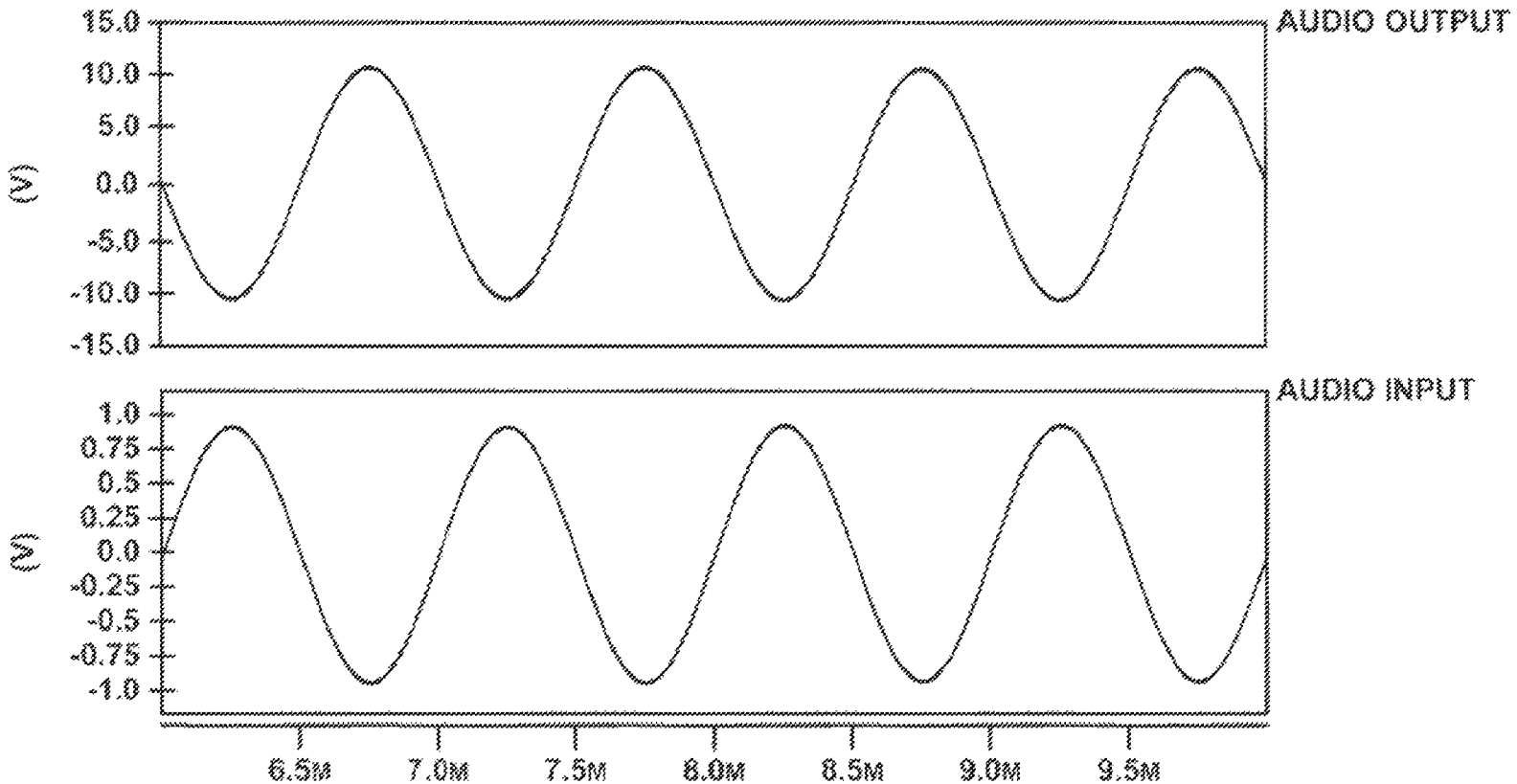
FIG. 12 (a) and FIG. 12 (b) illustrate part of the waveforms of the circuit shown in FIG. 11, in accordance with another embodiment.
Figure 12B:
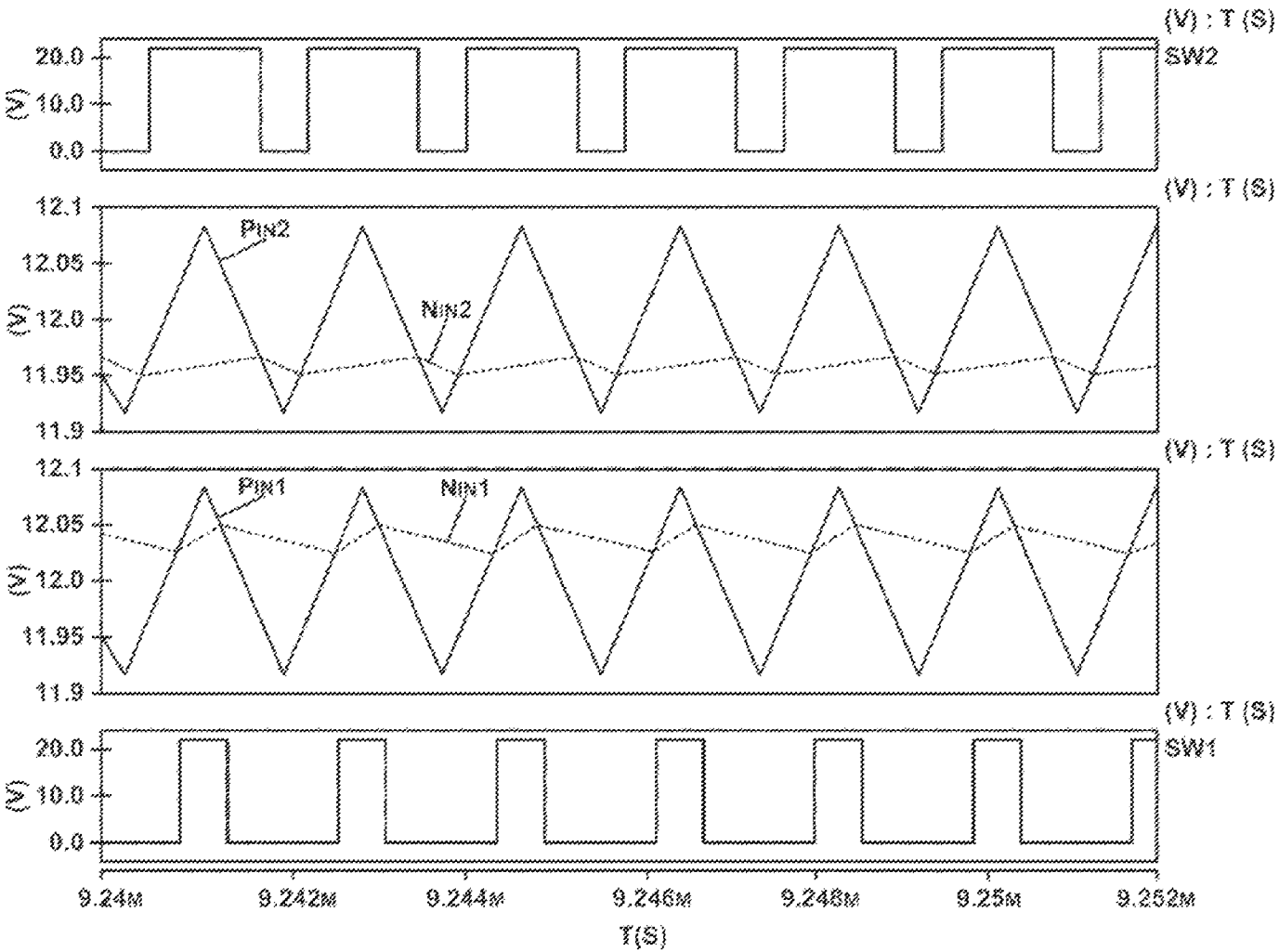

FIG. 11 illustrates a schematic circuit in accordance with another embodiment in BTL amplifier systems. In this embodiment, each half-bridge has its own special comparator to control two drive circuits separately. The switching frequency of each bridge is the same since they are set by the same external triangular wave at the Node A. The structure of the control circuit of each bridge is similar to that in the SE amplifier except the absence of the blocking capacitor (referring to the capacitor C2 in FIG. 3 and FIG. 6), and the gain may also be calculated by Rf/Ri. The input audio signal is a differential signal which is phase opposites applied at the inverting inputs B1 and B2 of the two comparators and compared with the triangular wave. FIG. 12 (a) illustrates an embodiment of the waveforms of the audio input and audio output of the circuit shown in FIG. 11, while FIG. 12(b) illustrates an embodiment of the partly magnified operation waveforms.

The drive circuits in FIG. 3, FIG. 6, FIG. 9 and FIG. 11 can be implemented by gate drive circuit or other circuits which can achieve the same function as an option. In addition, the number of the drive circuits in FIG. 3, FIG. 6, FIG. 9 and FIG. 11 is only schematically shown by way of example, and thus only needs to fulfill that the drive circuits can be controlled by respective comparator and drive respective transistor, rather than be the same with the number of the blocks representative of the drive circuits in the Figures mentioned above.

Figure 13:
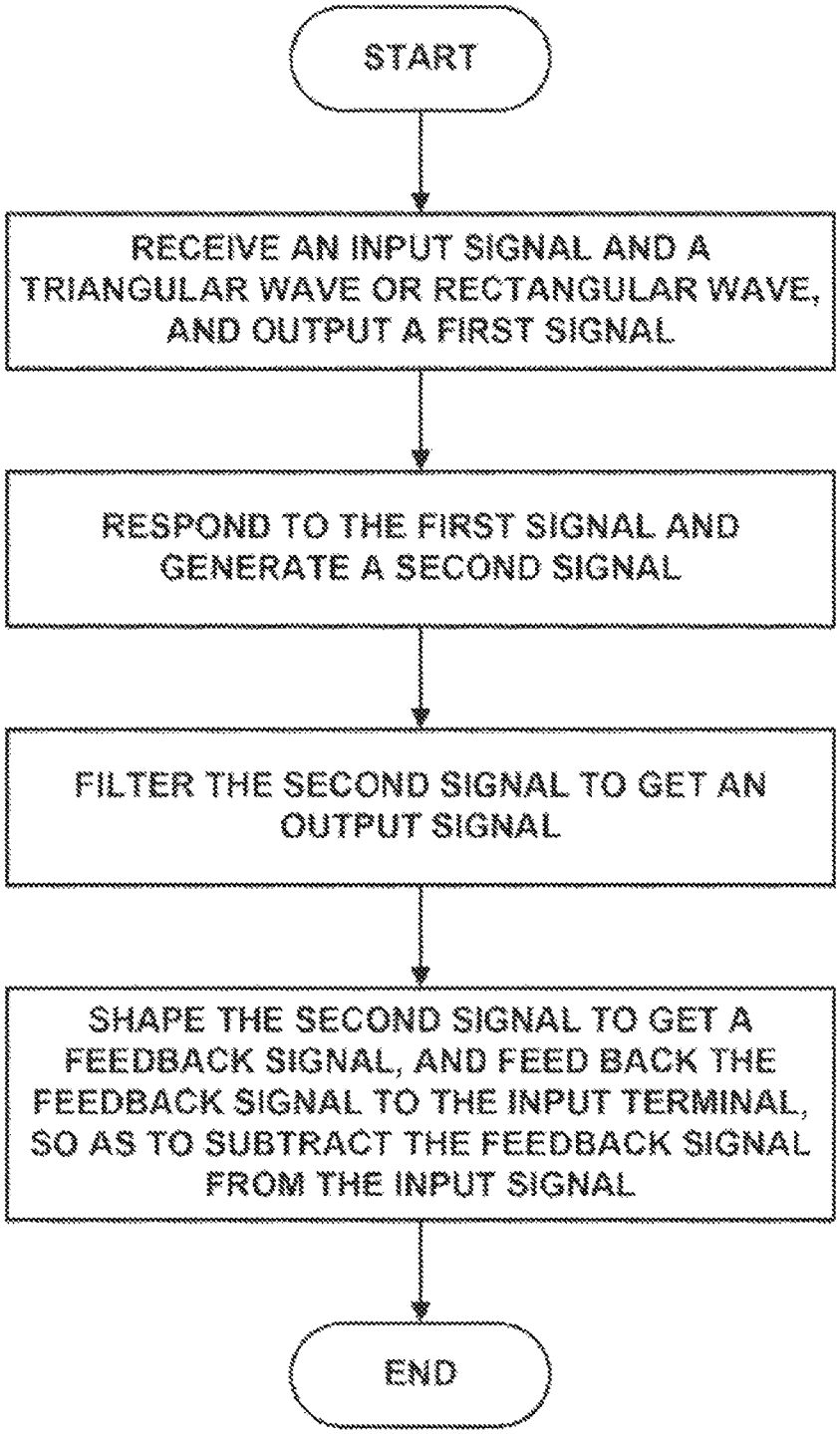
FIG. 13 is the flow chart of a control method for a close-loop Class-D power amplifier, in accordance with another embodiment.

Referring to FIG. 13, a control method for a close-loop Class-D power amplifier in accordance with one embodiment comprises the following operations:

Receive an input signal and a high-frequency triangular wave generated by a triangular wave generator or a high-frequency rectangular wave generated by a rectangular wave generator, and output a first signal;

Respond to said first signal and generate a second signal, e.g. the SW signal;

Filter the SW signal to get an output signal; and

Shape the SW signal to get a feedback signal, and feed back said feedback signal to the input terminal which also receives said input signal, so as to subtract the feedback signal from said input signal. Compared to the prior art AAM scheme, the present embodiment may only need to add a DC power supply with a ½ Vcc offset and a proper triangular wave or rectangular wave. After the integration of these parts, the close-loop fixed-frequency control of the Class-D power amplifier can be simply achieved.

The above detailed description of embodiments of the present invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize.

The terminology used in the Detailed Description is intended to be interpreted in its broadest reasonable manner, even though it is being used in conjunction with a detailed description of certain specific embodiments of the invention. Certain terms may even be emphasized; however, any terminology intended to be interpreted in any restricted manner will be overtly and specifically defined as such in this Detailed Description section. In general, the terms used in the following claims should not be construed to limit the invention to the specific embodiments disclosed in the specification, unless the above Detailed Description section explicitly defines such terms. Accordingly, the actual scope of the invention encompasses not only the disclosed embodiments, but also all equivalent ways of practicing or implementing the invention under the claims.

What is claimed is:

1. A close-loop class-D power amplifier, comprising:

an input stage for receiving an input signals said input stage comprising a comparator and one of a triangular wave generator and a rectangular wave generator, said comparator receiving said input signal and one of a high-frequency triangular wave generated by said triangular wave generator and a high-frequency rectangular wave generated by said rectangular wave generator, and outputting a first signal;

an output stage coupled to said input stage for responding to said first signal and generating a second signal;

a filter coupled to an output node of said output stage for filtering said second signal to get an output signal; and a feedback circuit coupled between an output node of said output stage and an input node of said input stage, said feedback circuit shaping said second signal to get a feedback signal, and negatively feeding back said feedback signal to said input stage, so as to subtract said feedback signal from said input signal;

wherein said high-frequency triangular wave is applied to a non-inverting input of said comparator, while said input signal and said feedback signal are applied to an inverting input of said comparator, said comparator comparing said high-frequency triangular wave with a signal which is gained by subtracting said feedback signal from said input signal, to get said first signal.

2. The class-D power amplifier as claimed in claim 1, wherein a DC offset voltage is applied to a non-inverting input of said comparator, while said input signal, said feedback signal and said high-frequency rectangular wave are applied to an inverting input of said comparator, said comparator comparing said DC offset voltage with a signal which is gained by subtracting said feedback signal from said input signal and adding said high-frequency rectangular wave, to get said first signal.

3. The class-D power amplifier as claimed in claim 1, wherein said feedback circuit comprises a capacitor, a first terminal of said capacitor coupled to said input signal, an inverting input of an amplifier and said second signal, a second terminal of said capacitor coupled to ground or a DC offset voltage.

4. The class-D power amplifier as claimed in claim 3, wherein said feedback circuit further comprises a feedback resistor coupled between said first terminal of said capacitor and said second signal.

5. The class-D power amplifier as claimed in claim 3, wherein said capacitor is charged/discharged by one of said high-frequency triangular wave and said high-frequency rectangular wave, and a charge/discharge effect on said capacitor is stronger than that of said second signal.

6. The class-D power amplifier as claimed in claim 1, wherein:

said output stage comprises:

a drive circuit coupled to said comparator; and a half-bridge switch circuit coupled to said drive circuit, said half-bridge switch circuit being turned on alternately according to drive signals generated by said drive circuit to generate said second signal.

7. The class-D power amplifier as claimed in claim 1, wherein:

said output stage comprises:

a drive circuit coupled to said comparator; and two half-bridge switch circuits coupled to said drive circuit, said two half-bridge switch circuits being turned on alternately according to drive signals generated by said drive circuit to generate two of said second signals and to feed back one of the two said second signals.

8. The class-D power amplifier as claimed in claim 1, wherein:

said input stage comprises two of said comparator; and said output stage comprises:

a drive circuit coupled to the two of said comparator separately; and two half-bridge switch circuits coupled to said drive circuit separately, said two half-bridge switch circuits being turned on alternately according to drive signals generated by said drive circuit to generate two of said second signals, and to feed back the two of said second signals to corresponding ones of the two of said comparator.

9. A control method for a close-loop Class-D power amplifier, comprising:

receiving an input signal and one of a high-frequency triangular wave generated by a triangular wave generator and a high-frequency rectangular wave generated by a rectangular wave generator;

outputting a first signal;

responding to said first signal to generate a second signal;

filtering said second signal to generate an output signal;

shaping said second signal to get a feedback signal; and feeding back said feedback signal to an input terminal which receives said input signal, so as to subtract said feedback signal from said input signals wherein said high-frequency triangular wave is applied to a non-inverting input of a comparator, while said input signal and said feedback signal are applied to an inverting input of said comparator, said comparator comparing said high-frequency triangular wave with a signal which is gained by subtracting said feedback signal from said input signal, to get said first signal.

10. The method as claimed in claim 9, wherein a DC offset voltage is applied to a non-inverting input of a comparator, while said input signal, said feedback signal and said high-frequency rectangular wave are applied to an inverting input of said comparator, said comparator comparing said DC offset voltage with a signal which is gained by subtracting said feedback signal from said input signal and adding said high-frequency rectangular wave, to get said first signal.

11. The method as claimed in claim 9, wherein a feedback circuit comprises a capacitor, a first terminal of said capacitor coupled to said input signal, an inverting input of an amplifier and said second signal, a second terminal of said capacitor coupled to ground or a DC offset voltage.

12. The method as claimed in claim 11, wherein said feedback circuit further comprises a feedback resistor coupled between said first terminal of said capacitor and said second signal.

13. The method as claimed in claim 11, wherein said capacitor is charged/discharged by one of said high-frequency triangular wave and said high-frequency rectangular wave, and a charge/discharge effect on said capacitor is stronger than that of said second signal.

14. The method as claimed in claim 9, wherein:

an input stage comprises a comparator;

a drive circuit is coupled to said comparator; and a half-bridge switch circuit is coupled to said drive circuit, said half-bridge switch circuit being turned on alternately according to drive signals generated by said drive circuit to generate said second signal.

15. The method as claimed in claim 9, wherein:

an input stage comprises two comparators;

a drive circuit is coupled to said comparators; and two half-bridge switch circuits are coupled to said drive circuit, said two half-bridge switch circuits being turned on alternately according to drive signals generated by said drive circuit to generate two of said second signal, and to feed back one of the two said second signals.

16. The method as claimed in claim 9, wherein:

an input stage comprises two comparators; and an output stage comprises:

a drive circuit coupled to said two comparators separately; and two half-bridge switch circuits coupled to said drive circuit separately, said two half-bridge switch circuits being turned on alternately according to drive signals generated by said drive circuit to generate two of said second signal, and to feed back the two of said second signal to corresponding ones of said two comparators.

* * * * *

UNITED STATES PATENT AND TRADEMARK OFFICE

CERTIFICATE OF CORRECTION

PATENT NO. : RE42,846 E
APPLICATION NO. : 12/968216
DATED : October 18, 2011
INVENTOR(S) : Zhang et al.

It is certified that error appears in the above-identified patent and that said Letters Patent is hereby corrected as shown below:

On the Title Page:

Item [64], Replace sub-heading, PCT Filed: with sub-heading, Filed.

Signed and Sealed this
First Day of November, 2011

David J. Kappos

David J. Kappos
*Director of the United States Patent and Trademark Office*